United States Patent
Wang et al.

(10) Patent No.: US 7,309,650 B1
(45) Date of Patent: Dec. 18, 2007

(54) MEMORY DEVICE HAVING A NANOCRYSTAL CHARGE STORAGE REGION AND METHOD

(75) Inventors: Connie Pin-Chin Wang, Mountain View, CA (US); Lu You, San Jose, CA (US); Zoran Krivokapic, Santa Clara, CA (US); Paul Raymond Besser, Sunnyvale, CA (US); Suzette Keefe Pangrle, Cupertino, CA (US)

(73) Assignees: Spansion LLC, Sunnyvale, CA (US); Advanced Micro Devices, Inc., Sunnyvale, CA (US)

( * ) Notice: Subject to any disclaimer, the term of this patent is extended or adjusted under 35 U.S.C. 154(b) by 323 days.

(21) Appl. No.: 11/065,388

(22) Filed: Feb. 24, 2005

(51) Int. Cl.
*H01L 21/44* (2006.01)

(52) U.S. Cl. .............................. 438/665; 257/E21.171; 438/783

(58) Field of Classification Search ............... 438/665, 438/783, 660, 720, 721, 785; 257/E21.171; 977/701
See application file for complete search history.

(56) References Cited

U.S. PATENT DOCUMENTS

| | | | |
|---|---|---|---|
| 5,852,306 A | 12/1998 | Forbes | 257/315 |
| 5,959,896 A | 9/1999 | Forbes | 365/185.33 |
| 6,060,743 A | 5/2000 | Sugiyama et al. | 257/321 |
| 6,262,129 B1 | 7/2001 | Murray et al. | 516/33 |
| 6,723,606 B2 | 4/2004 | Flagan et al. | 438/262 |
| 6,774,061 B2 | 8/2004 | Coffa et al. | 438/962 |
| 6,780,242 B2 | 8/2004 | Norris | 117/104 |
| 2002/0061646 A1 | 5/2002 | Kan et al. | 438/660 |
| 2002/0192949 A1 | 12/2002 | Kan et al. | 438/652 |
| 2003/0010987 A1 | 1/2003 | Banin et al. | 257/82 |
| 2003/0025133 A1 | 2/2003 | Brousseau, III | 257/213 |
| 2003/0077863 A1 | 4/2003 | Choi et al. | 438/257 |
| 2004/0002195 A1 | 1/2004 | Brousseau, III | 438/301 |
| 2004/0118698 A1 | 6/2004 | Lu et al. | 205/224 |
| 2004/0130941 A1 | 7/2004 | Kan et al. | 365/177 |
| 2004/0130951 A1 | 7/2004 | Forbes | 365/189.01 |
| 2005/0014335 A1 | 1/2005 | Goldbach et al. | 438/257 |
| 2006/0163646 A1* | 7/2006 | Black et al. | 257/316 |

OTHER PUBLICATIONS

Zengtao Liu, Chungho Lee, Venkat Narayanan, Gen Pei, and Edwin Chihchuan Kan, Metal Nanocrystal Memories—Part I: Device Design and Fabrication, IEEE Transactions on Electron Devices, vol. 49, No. 9, pp. 1606-1613, Sep. 2002.

(Continued)

*Primary Examiner*—Caridad Everhart
(74) *Attorney, Agent, or Firm*—Farjami & Farjami LLP

(57) ABSTRACT

A memory device having a metal nanocrystal charge storage structure and a method for its manufacture. The memory device may be manufactured by forming a first oxide layer on the semiconductor substrate, then disposing a porous dielectric layer on the oxide layer and disposing a second oxide layer on the porous dielectric layer. A layer of electrically conductive material is formed on the second layer of dielectric material. An etch mask is formed on the electrically conductive material. The electrically conductive material and the underlying dielectric layers are anisotropically etched to form a dielectric structure on which a gate electrode is disposed. A metal layer is formed on the dielectric structure and the gate electrode and treated so that portions of the metal layer diffuse into the porous dielectric layer. Then the metal layer is removed.

22 Claims, 3 Drawing Sheets

OTHER PUBLICATIONS

Zengtao Liu, Chungho Lee, Venkat Narayanan, Gen Pei, and Edwin Chihchuan Kan, Metal Nanocrystal Memories—Part II: Electrical Characteristics, IEEE Transactions on Electron Devices, vol. 49, No. 9, pp. 1614-1622, Sep. 2002.

M. Takata, S. Kondoh, T. Sakaguchi, H. Choi, J-C. Shim, H. Kurino and M. Koyanagi, New Non-Volatile Memory with Extremely High Density Metal Nano-Dots, Technical Digest, 2003 IEEE International Electron Devices Meeting, Washington DC, pp. 553-556.

* cited by examiner

-PRIOR ART-

MEMORY DEVICE HAVING A NANOCRYSTAL CHARGE STORAGE REGION AND METHOD

FIELD OF THE INVENTION

This invention relates, in general, to memory devices and, more particularly, to memory devices having metal nanocrystals in a charge storage region.

BACKGROUND OF THE INVENTION

Memory devices are used in a variety of electronic systems including computers, cellular phones, pagers, personal digital assistants, avionic systems, automotive systems, industrial control systems, appliances, etc. Depending on the particular system configuration, the memory devices may be either non-volatile or volatile. A non-volatile memory device retains the data or instructions when the device is turned off or power is removed. A volatile memory device, on the other hand, does not retain the stored data or instructions when the device is turned off. Flash memory has become an important type of non-volatile memory because it is less expensive to manufacture and denser than most other types of memory devices. In addition, Flash memory is electrically erasable and has a life span of up to one million write cycles.

As semiconductor device manufacturers shrink memory devices such as Flash memories and Dynamic Random Access Memories (DRAM's), the charge storage area in these devices decreases resulting in fewer stored electrons. One technique for increasing the number of stored electrons has been to incorporate nanocrystals in the charge storage region of a memory device. FIG. 1 illustrates a prior art memory device 10 having a layer of nanocrystal material disposed in the charge storage region. What is shown in FIG. 1 is a semiconductor substrate 12 on which a gate structure 14 is formed. Gate structure 14 includes a gate conductor 22 disposed on a dielectric stack comprising a tunnel oxide layer 16, a metal nanocrystal layer 18, and a control oxide layer 20. Source and drain regions 24 and 26, respectively, are formed in the portions of substrate 12 adjacent gate structure 14. Metal nanocrystal layer 18 is formed by depositing a thin metal layer on tunnel oxide layer 16, and annealing the metal at high temperatures to cause the metal to agglomerate. Each metal agglomerate is a nanocrystal. The thin metal layer from which the nanocrystals are formed is typically gold, platinum silicide, silver, or nickel.

A drawback with this procedure is that the agglomeration process is random, thus there is a large variation in the size distribution of the nanocrystals. In addition, the mean size of the nanocrystal is sensitive to the local temperature and metal film thickness, making it difficult to control their size distribution on large diameter semiconductor wafers. Because the threshold voltage ($V_t$) is dependent on the size of the nanocrystals, a large variation in nanocrystal size results in a large variation in the threshold voltage across the semiconductor wafer. Another drawback is that disposing the control oxide layer on the nanocrystals oxidizes them thereby degrading their charge storage capacities. Other drawbacks of using the agglomeration process include the cost and complexity of using metals such as gold, platinum silicide, silver, and nickel to form the thin metal layer and the inability of the control oxide to sufficiently fill the spaces between small dimension nanocrystals.

Accordingly, it would be advantageous to have a charge storage structure and a method for manufacturing the charge storage structure that allows formation of nanocrystals having a uniform size and that limits the oxidation of the nanocrystals. It would be of further advantage for the structure and method to be cost and time efficient and compatible with memory device manufacturing processes.

SUMMARY OF THE INVENTION

The present invention satisfies the foregoing need by providing a memory device having a metal nanocrystal charge storage region and a method for manufacturing the memory device. In accordance with one embodiment, the present invention includes providing a substrate and forming a first layer of dielectric material on the substrate. A porous layer of dielectric material is formed on the first layer of dielectric material. An electrically conductive material is diffused into the porous dielectric layer to form a nanocrystal charge storage region. A second layer of dielectric material is disposed on the nanocrystal charge storage region.

In accordance with another embodiment, the present invention comprises a method for manufacturing a memory device having a metal nanocrystal charge storage region. A substrate is provided and a dielectric structure is formed over the substrate. The dielectric structure has a porous region. An electrically conductive material is diffused into the porous region and a gate conductor is formed over the dielectric structure.

In accordance with yet another embodiment, the present invention comprises a memory device having a metal nanocrystal charge storage region. The memory device includes a semiconductor substrate on which a dielectric structure is disposed. A portion of the dielectric structure includes the metal nanocrystal charge storage region which has at least one metal nanocrystal comprising a pore in which metal is disposed. A gate conductor is disposed on the dielectric structure.

BRIEF DESCRIPTION OF THE DRAWINGS

The present invention will be better understood from a reading of the following detailed description, taken in conjunction with the accompanying drawing figures, in which like reference numbers designate like elements, and in which.

DETAILED DESCRIPTION

Figure 1:
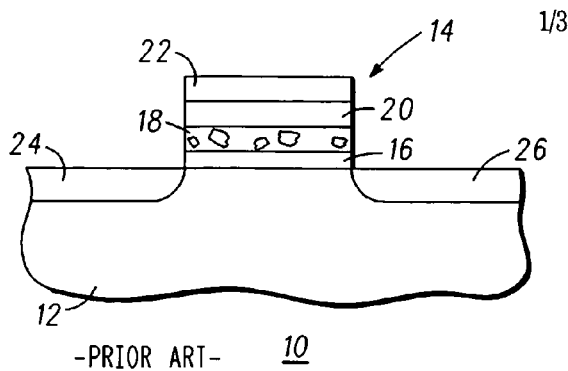
FIG. 1 is a cross-sectional side view of a memory device in accordance with the prior art.
Figure 2:
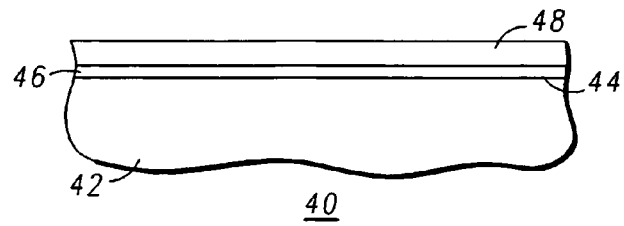
FIG. 2 is cross-sectional side view of a memory device at an early stage of manufacture in accordance with an embodiment of the present invention.

FIG. 2 is an enlarged cross-sectional side view of a portion of a partially completed memory device 40 during processing in accordance with an embodiment of the present invention. What is shown in FIG. 2 is a semiconductor substrate 42 having a major surface 44. Suitable materials for substrate 42 include silicon, germanium, Semiconductor-On-Insulator (SOI), silicon germanium, gallium arsenide, indium phosphide, other compound semiconductor materials, or the like. The semiconductor material may also be a semiconductor substrate having an epitaxial layer formed thereon. A layer of dielectric material 46 having a thickness ranging from about 20 Angstroms (Å) to about 50 Å is formed on substrate 42. By way of example, layer of dielectric material 46 is oxide grown by dry oxidation. It should be noted that the type of dielectric material for dielectric layer 46 and the technique for forming dielectric layer 46 are not limitations of the present invention. A layer of dielectric material 48 having a thickness ranging from about 1,000 Å to about 10,000 Å is formed on oxide layer 46. Dielectric layer 48 is a precursor layer for a porous dielectric layer. More particularly, dielectric layer 48 will be transformed into a porous dielectric layer in a subsequent process step. Suitable techniques for disposing dielectric layer 48 on oxide layer 46 include Chemical Vapor Deposition (CVD), spin-on coating, e.g., a Spin-On Glass (SOG), a SolGel process, or the like. In accordance with one embodiment, dielectric layer 48 is formed by mixing a porogen with a dielectric material and disposing the porogen-dielectric material mixture on dielectric layer 46 to form a porogen-dielectric layer. Suitable poragens include, but are not limited to, polymers such as, for example, siloxane, polyethylene, polypropylene, polystyrene, poly(isobutylene), poly(propyl acrylate), poly(butadiene), poly(vinyl acetate), poly(methyl methacrylate), poly(ethylene terephtalate), poly(vinyl alcohol), poly(acrylonitrile), poly(cyanomethyl acrylate), poly(aminocaprylic acid), and poly(hexamethylene adipamide).

Figure 3:
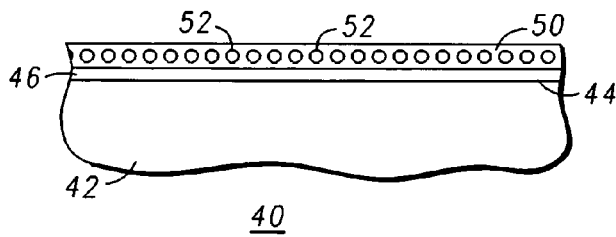
FIG. 3 is a cross-sectional side view of the memory device of FIG. 2 at a later stage of manufacture.

Referring now to FIG. 3, porogen-dielectric layer 48 is heated to a temperature ranging from about 120 degrees Celsius (° C.) to about 375° C. to volatilize the porogen and transform porogen-dielectric layer 48 into a porous layer of dielectric material 50. Volatilizing the porogen leaves pores or openings in those regions of dielectric material 48 that contained the porogen. Because of the presence of pores 52, layer of dielectric material 50 is also referred to as a porous dielectric layer or a porous region. The technique for volatilizing the porogen is not a limitation of the present invention. Other suitable techniques include treatment in a sonication bath, electron beam fragmentation, electron beam fragmentation followed by heat treatment, dissolution in a suitable solvent, or the like. Advantages of forming pores 52 using a porogen are that the size of the pores and the distribution of the pores are well controlled. Thus, memory devices having stable threshold voltages can be repeatably manufactured.

In accordance with another embodiment, porous dielectric layer 50 comprises a dielectric material having a crystalline lattice structure wherein spaces or openings are within the crystalline lattice structure. In this embodiment, the spaces or openings in the crystalline lattice structure serve as pores 52. Dielectric materials having crystalline lattice structures suitable for acting as pores include alumina oxide, silicon oxide, and many forms of zeolites. A zeolite is a general term for crystalline porous alumino silicates. Zeolites can have a number of pores ranging from about 4 Å to about 800 Å in size. Because the pores result from the crystallization of the dielectric material, these materials are referred to as dielectric self-assembly materials. The dielectric self-assembly materials can be formed on oxide layer 46 using CVD, SOG, or Solgel processes. Forming pores 52 from a crystalline lattice structure is advantageous because the size of the pores and their distribution can be well controlled. Further, the techniques for forming the crystalline structures are compatible with semiconductor manufacturing processes.

Figure 4:
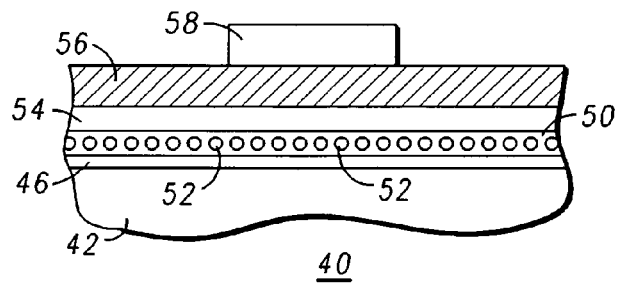
FIG. 4 is a cross-sectional side view of the memory device of FIG. 3 at a later stage of manufacture.

Referring now to FIG. 4, a layer of dielectric material 54 having a thickness ranging from about 70 Å to about 200 Å is disposed on porous dielectric layer 50. The thickness of dielectric layer 54 is based on its dielectric constant. For example, materials with low dielectric constants may be thinner than materials with high dielectric constants. By way of example, layer of dielectric material 54 is oxide that is deposited using plasma enhanced chemical vapor deposition (PECVD). It should be noted that the type of dielectric material for dielectric layer 54 and the technique for forming dielectric layer 54 are not limitations of the present invention.

A layer of conductive material 56 is formed on oxide layer 50. In accordance with one embodiment, conductive layer 56 is a metal layer formed using a reactive sputtering method. Suitable metals include metal nitrides such as, for example, tantalum nitride (TaN), titanium nitride (TiN), tungsten nitride (WN), molybdenum nitride (MoN), zirconium nitride (ZrN), hafnium nitride (HfN), or the like. In addition, conductive layer 56 may be comprised of metals having work functions near the valence band. Examples of these types of metals include nickel (Ni), platinum (Pt), ruthenium (Ru), ruthenium oxide (RuO$_2$), or the like. In accordance with another embodiment, conductive layer 56 is a metal layer formed by using chemical vapor deposition (CVD) or Atomic Layer Deposition (ALD). Suitable metals for CVD deposition include, but are not limited to, tungsten (W), molybdenum (Mo), tantalum nitride (TaN), tantalum silicon nitride (TaSiN), or the like. In accordance with yet another embodiment, conductive layer 56 is a polysilicon layer such as for example, a p-type doped polysilicon layer. A layer of photoresist is formed on conductive layer 56 and patterned to form an etch mask 58.

Figure 5:
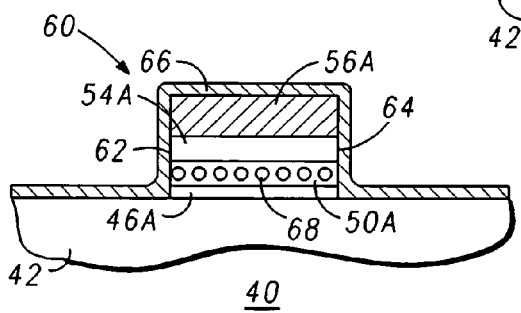
FIG. 5 is a cross-sectional side view of the memory device of FIG. 4 at a later stage of manufacture.

Referring now to FIG. 5, the portions of conductive layer 56, oxide layer 54, porous oxide layer 50, and oxide layer 46 not protected by etch mask 58 are anisotropically etched to form a gate structure 60 having sidewalls 62 and 64. By way of example, layers 56, 54, 50, and 46 are etched using reactive ion etching, wherein substrate 42 serves as an etch stop layer. After the anisotropic etch step, portion 46A of oxide layer 46 remains and serves as a tunnel oxide; portion 50A of porous oxide layer 50 remains and serves as a metal nanocrystalline charge storage layer; portion 54A of oxide layer 54 remains and serves as a control oxide; and portion 56A of conductive layer 56 remains and serves as a gate conductor. A metal layer or film 66 is formed on gate structure 60 using either an atomic layer deposition (ALD) process or a CVD process. Preferably, the metal is formed using halide precursors such as, for example, titanium chloride ($TiCl_4$) or tungsten hexafluoride ($WF_6$). Metal layer 66 is formed using a metal precursor that is capable of diffusing into porous dielectric layer 50 and thereby forming metal nanocrystals 68. More particularly, the metal precursor diffuses into porous dielectric layer 50 and into pores 52 of porous dielectric layer 50 from sides 62 and 64. The metal either partially or completely fills pores 52. Thus, pores 52 and the diffused metal cooperate to form metal nanocrystals 68. Nanocrystals 68 are also referred to as nanoparticles. The portion of gate structure 60 having dielectric material 50A and nanocrystals 68 is referred to as a nanocrystal charge storage region. An advantage of using an ALD or a CVD process to form metal layer 66 with a halide precursor is that these precursors are small and easily diffuse into or penetrate the pores. In accordance with one embodiment, metal layer 66 is a titanium nitride film formed using an ALD process with a reducing agent, where the titanium (Ti) is derived from titanium tetrachloride ($TiCl_4$) and the reducing agent is an ammonia ($NH_3$) plasma.

In accordance with another embodiment, metal layer 66 is a tantalum (Ta) film formed using an ALD process with a reducing agent, where the tantalum is derived from either tantalum pentachloride ($TaCl_5$) or tantalum pentafluoride ($TaF_5$) and the reducing agent is either a hydrogen ($H_2$) plasma or an ammonia ($NH_3$) plasma.

In accordance with yet another embodiment, metal layer 66 is a tantalum nitride (TaN) film formed using an ALD process with a non-halide based precursor such as, for example, pentakis(dimethylamido)tantalum (PDMAT) or t-butylimino tris(diethylamino)tantalum (TBTDET) in an ammonia ($NH_3$) plasma.

In accordance with yet another embodiment, metal layer 66 is a tungsten (W) film formed using an ALD process where the tungsten (W) is derived from tungsten hexafluoride ($WF_6$) in the presence of silane ($SiH_4$) or an ammonia ($NH_3$) plasma.

In accordance yet another embodiment, metal layer 66 is a titanium (Ti) film formed using either an ALD process or a CVD process with a reducing agent, where the titanium (Ti) is derived from titanium tetrachloride ($TiCl_4$) and the reducing agent is ammonia ($NH_3$).

In accordance with yet another embodiment, metal layer 66 is a ruthenium (Ru) film formed using a CVD process.

In accordance with another embodiment, metal layer 66 is a silver layer formed using either an ALD process or a CVD process with a reducing agent, wherein the silver is derived from silver chloride and the reducing agent comprises a hydrogen radical. It should be understood that these are exemplary embodiments for forming metal layer 66 and that formation of metal layer 66 is not limited to these embodiments. For example, other suitable metals include gold, nickel, platinum silicide, or the like.

After formation of metal layer 66, it may be desirable to anneal nanocrystals 68 in porous dielectric layer 50 to agglomerate the metal within pores 52 to ensure electrical isolation of nanocrystals 68 from each other. In addition, annealing nanocrystals 68 may complete the formation of metal layer 66, i.e., it may reduce the impurities in metal layer 66, reduce metal layer 66, or densify the film. Nanocrystals 68 may be annealed in a reducing environment such as, for example a hydrogen or a nitrogen ambient, or in a vacuum. Preferably, nanocrystals 68 are annealed at a temperature ranging from about 400° C. to about 1,000° C. for a time ranging from about one minute to about ten minutes.

Figure 6:
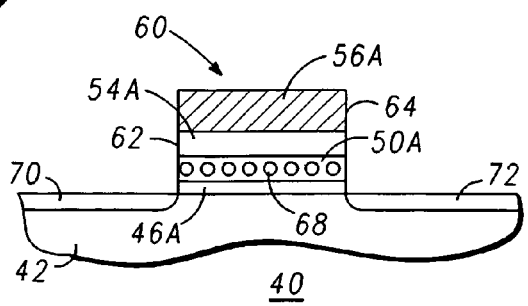
FIG. 6 is a cross-sectional side view of the memory device of FIG. 5 at a later stage of manufacture.

Referring now to FIG. 6, metal layer 66 is removed using either an anisotropic reactive ion etch or an anisotropic wet etch. It should be understood that nanocrystals 68 may be annealed either before or after the removal of metal layer 66. Source and drain extension regions 70 and 72, respectively, are formed in substrate 42.

Figure 7:
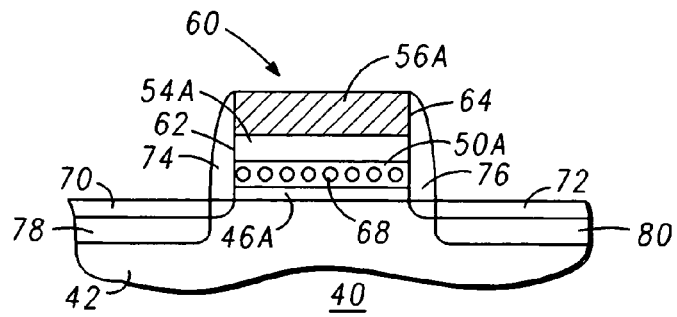
FIG. 7 is a cross-sectional side view of the memory device of FIG. 6 at a later stage of manufacture.

Referring now to FIG. 7, sidewall spacers 74 and 76 are formed along sidewalls 62 and 64, respectively. Source and drain regions 78 and 80 are formed in the portions of substrate 42 adjacent spacers 74 and 76, respectively.

Figure 8:
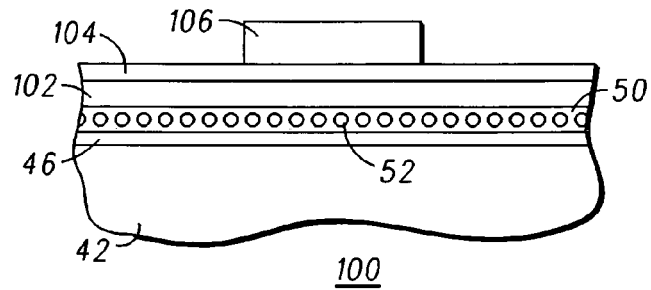
FIG. 8 is cross-sectional side view of a memory device at an early stage of manufacture in accordance with another embodiment of the present invention.

FIG. 8 illustrates a memory device 100 at an early stage of manufacture in accordance with another embodiment of the present invention. The beginning processing steps for memory device 100 are similar to those for memory device 10. Thus, the description of FIG. 8 continues from FIG. 3 with the modification that the memory device beginning in FIG. 8 is identified by reference number 100. A layer of amorphous silicon 102 having a thickness ranging from about 100 Å to about 5,000 Å is formed on porous oxide layer 50. An antireflective coating or film 104 having a thickness ranging from about 100 Å to about 700 Å is formed on amorphous silicon layer 102. By way of example, anti-reflective coating 104 is silicon nitride. The thicknesses of amorphous silicon 102 and antireflective coating 104 are not limitations of the present invention. A layer of photoresist is formed on antireflective coating 104 and patterned to form an etch mask 106.

Figure 9:
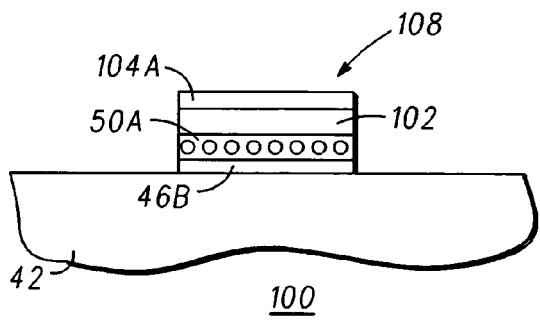
FIG. 9 is a cross-sectional side view of the memory device of FIG. 8 at a later stage of manufacture.

Referring now to FIG. 9, the portions of antireflective coating 104, amorphous silicon layer 102, porous oxide layer 50, and oxide layer 46 that are unprotected by etch mask 106 are anisotropically etched to form a disposable stack 108. By way of example, layers 104, 102, 50, and 46 are etched using reactive ion etching, wherein substrate 42 serves as an etch stop layer. After formation of disposable stack 108, portion 104A of anti-reflective coating 104, portion 102A of amorphous silicon layer 102, portion 46B of oxide layer 46 remains, and portion 50B of porous oxide layer 50 remain.

Figure 10:
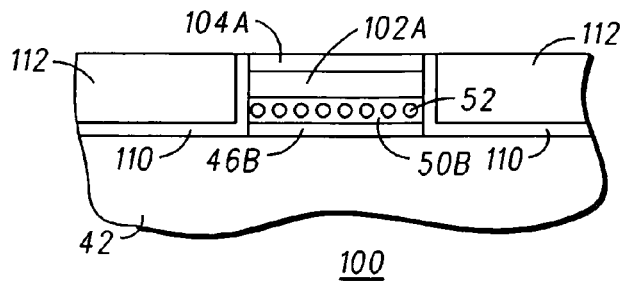
FIG. 10 is a cross-sectional side view of the memory device of FIG. 9 at a later stage of manufacture.

Referring now to FIG. 10, a conformal layer of silicon oxynitride (SiON) 110 is formed on disposable stack 108 and on the exposed portions of semiconductor substrate 42. A layer of dielectric material 112 is formed on silicon oxynitride layer 110. Dielectric layer 112 is planarized to expose the portion of silicon oxynitride layer 110 that is on portion 104A of antireflective coating 104. By way of example, dielectric layer 112 is a TEOS layer. After exposing the portion of silicon oxynitride layer 110, the planarization process continues and exposes portion 104A of antireflective coating 104, which serves as an etch stop layer. By way of example, dielectric layer 112 and silicon oxynitride layer 110 are planarized using chemical mechanical planarization.

Figure 11:
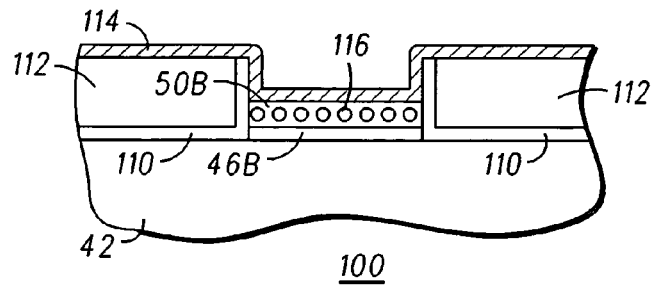
FIG. 11 is a cross-sectional side view of the memory device of FIG. 10 at a later stage of manufacture.

Referring now to FIG. 11, portion 104A of antireflective coating 104 and portion 102A of amorphous silicon layer 102 are removed using a reactive ion etch to expose porous dielectric layer 50B. A metal layer or film 114 is formed on porous dielectric layer 50B, dielectric layer 112, and the exposed portions of silicon oxynitride layer 110 using either an atomic layer deposition (ALD) process or a chemical vapor deposition (CVD process). Like metal layer 66 of the embodiment described with reference to FIGS. 1-7, metal layer 114 is formed using a metal precursor that is capable of diffusing into or penetrating pores 52 of porous dielectric layer 50B. The metal either partially or completely fills pores 52. Thus, the metal and the pores cooperate to form metal nanocrystals 116. The methods and materials suitable for forming metal layer 114 are the same as those described for the formation of metal layer 66.

Figure 12:
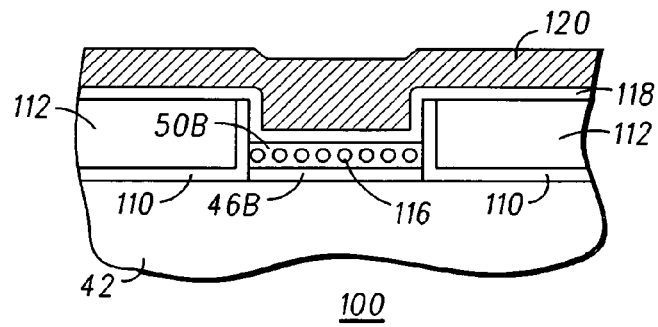
FIG. 12 is a cross-sectional side view of the memory device of FIG. 11 at a later stage of manufacture.

Referring now to FIG. 12, metal layer 114 is removed using either an anisotropic reactive ion etch or an anisotropic wet etch. After formation of metal layer 114, it may be desirable to anneal nanocrystals 116 in porous dielectric layer 50B. Annealing nanocrystals 116 agglomerates the metal within porous dielectric layer 50B and thereby electrically isolates nanocrystals 116 from each other. In addition, annealing nanocrystals 116 may complete the formation of metal layer 114, i.e., it may reduce the impurities within metal layer 114, reduce metal layer 114, or densify the film. By way of example, nanocrystals 116 are annealed in a reducing environment such as, for example, a hydrogen or a nitrogen ambient, or in a vacuum. Preferably, nanocrystals 116 are annealed at a temperature ranging from about 400° C. to about 1,000° C. for a time ranging from about one minute to about ten minutes. It should be understood that the nanocrystals may be annealed either before or after the removal of metal layer 114.

A conformal layer of dielectric material 118 having a thickness ranging from about 70 Å to about 200 Å is disposed on dielectric layers 112 and 52B. By way of example, layer of dielectric material 118 is oxide that is deposited using plasma enhanced chemical vapor deposition (PECVD). It should be noted that the type of dielectric material for dielectric layer 118 and the techniques for forming dielectric layer 118 are not limitations of the present invention.

A layer of conductive material 120 is formed on oxide layer 118. In accordance with one embodiment, conductive layer 120 is a metal layer formed using a reactive sputtering method. Suitable metals for conductive layer 118 include metal nitrides such as, for example, tantalum nitride (TaN), titanium nitride (TiN), tungsten nitride (WN), molybdenum nitride (MoN), zirconium nitride (ZrN), hafnium nitride (HfN), or the like. In addition, conductive layer 118 may be comprised of metals having work functions near the valence band. Examples of these types of metals include nickel (Ni), platinum (Pt), ruthenium (Ru), ruthenium oxide ($RuO_2$), or the like. In accordance with another embodiment, conductive layer 120 is a metal layer formed by using chemical vapor deposition (CVD) or Atomic Layer Deposition (ALD). Suitable metals for CVD deposition include, but are not limited to, tungsten (W), molybdenum (Mo), tantalum nitride (TaN), and tantalum silicon nitride (TaSiN), or the like. In accordance with yet another embodiment, conductive layer 116 is a polysilicon layer such as, for example, a p-type doped polysilicon layer. A layer of photoresist is formed on conductive layer 120 and patterned to form an etch mask 122.

Figure 13:
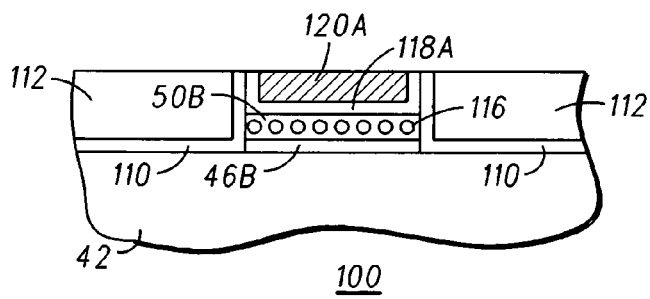
FIG. 13 is a cross-sectional side view of the memory device of FIG. 12 at a later stage of manufacture.

Referring now to FIG. 13, conductive layer 120 and conformal oxide layer 118 are planarized using, for example, chemical mechanical planarization. After planarization, portion 118A of oxide layer 118 remains and portion 120A of conductive layer 120 remain.

Figure 14:
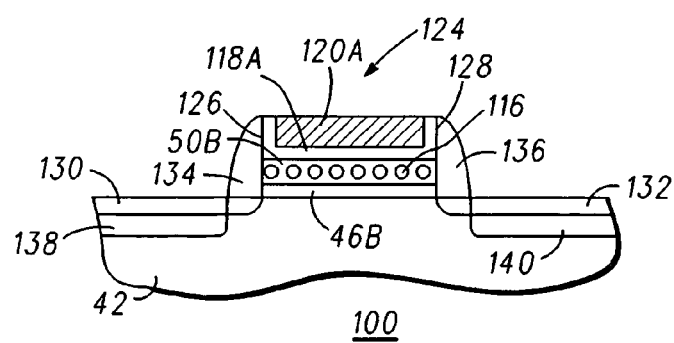
FIG. 14 is a cross-sectional side view of the memory device of FIG. 13 at a later stage of manufacture.

Referring now to FIG. 14, oxide layer 112 and silicon oxynitride layer 116 are removed to form a gate structure 124 having sidewalls 126 and 128. Gate structure 124 comprises portion 46B of oxide layer 46 which remains and serves as a tunnel oxide; portion 50B of porous oxide layer 50 which remains and serves as a metal nanocrystalline charge storage layer; portion 118A of oxide layer 118 which remains and serves as a control oxide; and portion 120A of conductive layer 120 which remains and serves as a gate conductor. Source and drain extension regions 130 and 132 are formed in the regions of substrate 42 adjacent sidewalls 126 and 128, respectively. Sidewall spacers 134 and 136 are formed adjacent sidewalls 126 and 128 and source and drain regions 138 and 140, respectively, are formed in the portions of substrate 42 adjacent spacers 134 and 136.

By now it should be appreciated that a memory device and a method for refreshing the memory device have been provided, wherein the memory device includes a metal nanocrystal charge storage structure. An advantage of the present invention is that the size of the nanocrystals across the wafer is well controlled, which results in the memory devices having a well controlled threshold voltage ($V_t$). In addition, the metal nanocrystals made in accordance with the present invention are resistant to oxidation. The present invention also offers the advantage of using a greater variety of metals to form the nanocrystals. For example, metals like titanium nitride (TiN), tungsten (W), and tantalum nitride (TaN) have a higher melting temperature which is suitable for use in high temperature semiconductor processes. On the other hand, metals like silver, gold, platinum silicide and nickel can be used without suffering the drawbacks encountered in agglomeration processes.

Although certain preferred embodiments and methods have been disclosed herein, it will be apparent from the foregoing disclosure to those skilled in the art that variations and modifications of such embodiments and methods may be made without departing from the spirit and scope of the invention. For example, in the embodiment described with reference to FIGS. 8-13, the source and drain extension regions and the source and drain regions can be formed after formation of disposable stack 108, i.e., earlier in the process flow. Further, the nanocrystal charge storage region can have multiple layers of nanocrystals formed from multiple layers of pores. This increases the charge storage capacity. It is intended that the invention shall be limited only to the extent required by the appended claims and the rules and principles of applicable law.

What is claimed is:

1. A method for manufacturing a memory device, comprising:
   providing a substrate;
   forming a first layer of dielectric material on the substrate;
   forming a porous dielectric layer on the first layer of dielectric material;
   diffusing an electrically conductive material into the porous dielectric layer to form a nanocrystal charge storage region; and
   forming a second layer of dielectric material on the porous dielectric layer.

2. The method of claim 1, further including forming an electrically conductive material over the second layer of dielectric material.

3. The method of claim 2, wherein the forming the electrically conductive material over the second layer of dielectric material comprises forming an electrically conductive material from one of a metal or a semiconductor material.

4. The method of claim 1, wherein forming the porous dielectric layer comprises disposing a dielectric material that self-assembles.

5. The method of claim 4, wherein disposing the dielectric material that self-assembles comprises disposing the dielectric material using a method selected from the group of methods comprising chemical vapor deposition, spin-on coating, and a SolGel process.

6. The method of claim 1, wherein forming the porous dielectric layer comprises:
   disposing a porogen containing dielectric material on the first layer of dielectric material; and removing at least a portion of the porogen to form pores in the dielectric material disposed on the first layer of dielectric material.

7. The method of claim 6, wherein removing at least a portion of the porogen comprises heating the porogen containing dielectric material to a temperature ranging from about 120 degrees Celsius to about 375 degrees Celsius.

8. The method of claim 6, wherein disposing the porogen containing dielectric material comprises depositing the porogen containing material using a method selected from the group of methods comprising chemical vapor deposition, spin-on coating, and a SolGel process.

9. The method of claim 6, wherein diffusing the material into the porous dielectric layer includes forming a layer of metal on the porous dielectric material and diffusing a portion of the layer of metal into the pores.

10. The method of claim 9, wherein forming the layer of metal comprises using one of an atomic layer deposition process or a chemical vapor deposition process.

11. The method of claim 10, wherein forming the layer of metal comprises depositing the layer of metal using atomic layer deposition, and wherein the metal is a metal selected from the group of metals comprising titanium, tungsten, and tantalum.

12. The method of claim 9, further including forming the layer of metal before forming the second layer of dielectric material.

13. The method of claim 9, further including forming the layer of metal after forming the second layer of dielectric material.

14. A method for manufacturing a memory device having a metal nanocrystal charge storage region, comprising:
providing a substrate;
forming a dielectric structure over the substrate, the dielectric structure having a porous region;
diffusing an electrically conductive material into the porous region; and
forming a gate conductor over the dielectric structure.

15. The method of claim 14, wherein forming the dielectric structure comprises:
forming a first layer of dielectric material over the substrate;
forming a second layer of dielectric material over the first layer of dielectric material;
forming a third layer of dielectric material over the second layer of dielectric material;
forming an etch mask on the third layer of dielectric material; and
anisotropically etching the third layer of dielectric material, the second layer of dielectric material, and the first layer of dielectric material to form the dielectric structure, wherein the dielectric structure has first and second sidewalls.

16. The method of claim 15, wherein diffusing the electrically conductive material into the porous region includes forming a layer of electrically conductive material on the dielectric structure, and wherein a portion of the metal diffuses into the porous region of the dielectric stack.

17. The method of claim 16, further including annealing the metal that diffused into the porous region.

18. The method of claim 14, wherein forming the dielectric structure comprises:
forming a first layer of dielectric material over the substrate;
forming a porous layer of dielectric material over the first layer of dielectric material;
forming an etch mask on the porous layer of dielectric material; and
anisotropically etching the porous layer of dielectric material and the first layer of dielectric material to form the dielectric structure, wherein the dielectric structure has first and second sidewalls.

19. The method of claim 18, wherein diffusing the electrically conductive material into the porous region includes forming a layer of electrically conductive material on the dielectric structure, and wherein a portion of the metal diffuses into the porous region of the dielectric stack.

20. The method of claim 19, further including:
forming a second layer of dielectric material over the dielectric structure and the substrate;
forming a layer of conductive material on the second layer of dielectric material; and
anisotropically etching the layer of conductive material and the second layer of dielectric material.

21. A memory device having a metal nanocrystal charge storage region, comprising:
a semiconductor substrate;
a dielectric structure disposed on the semiconductor substrate, wherein a portion of the dielectric structure includes the metal nanocrystal charge storage region formed by diffusion of metal into pores formed in said dielectric structure; and
a gate conductor disposed on the dielectric structure.

22. The memory device of claim 21, wherein the dielectric structure comprises:
a tunnel oxide disposed on the semiconductor substrate;
the metal nanocrystal charge storage region disposed on the tunnel oxide; and
a control oxide disposed on the metal nanocrystal charge storage region.

* * * * *